United States Patent
Wang et al.

(10) Patent No.: US 8,629,694 B1
(45) Date of Patent: Jan. 14, 2014

(54) METHOD AND APPARATUS OF VOLTAGE SCALING TECHNIQUES

(71) Applicant: Taiwan Semiconductor Manufacturing Company, Ltd., Hsin-Chu (TW)

(72) Inventors: Shi-Hung Wang, Taichung (TW); Tsung-Hsiung Li, New Taipei (TW); Kuang-Kai Yen, Kaohsiung (TW); Wei-Li Chen, Hsin-Chu (TW); Chewn-Pu Jou, Hsin-Chu (TW); Fan-Ming Kuo, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/668,860

(22) Filed: Nov. 5, 2012

Related U.S. Application Data (60) Provisional application No. 61/711,849, filed on Oct. 10, 2012.

(51) Int. Cl.
 *H03K 5/22* (2006.01)
(52) U.S. Cl.
 USPC .................. 327/24; 327/26; 327/35; 341/155
(58) Field of Classification Search
 USPC .............. 327/24–26, 31, 35, 37–38; 341/155, 341/166
 See application file for complete search history.

(56) References Cited

U.S. PATENT DOCUMENTS

| | | | | |
|---|---|---|---|---|
| 7,956,660 | B2 * | 6/2011 | Ooshima et al. | 327/175 |
| 8,031,007 | B2 * | 10/2011 | Chang et al. | 331/1 A |
| 8,174,293 | B2 * | 5/2012 | Yoshihara et al. | 327/107 |
| 2008/0111720 | A1 * | 5/2008 | Huang et al. | 341/53 |
| 2011/0267096 | A1 | 11/2011 | Chlipala et al. | |

OTHER PUBLICATIONS

Miyazaki, Masayuki, et al., "3.4 A 175mV Multiply-Accumulate Unit Using an Adaptive Supply Voltage and Body Bias (ASB) Architecture," 2002 IEEE International Solid-State Circuits Conference, Feb. 4, 2002, 3 pages.

* cited by examiner

*Primary Examiner* — An Luu
(74) *Attorney, Agent, or Firm* — Slater & Matsil, L.L.P.

(57) ABSTRACT

A voltage scaling circuit includes a first critical path and an edge detection unit. The first critical path includes an input and an output. The edge detection unit includes a first input, a second input, a counter and a time-to-digital converter (TDC). The input of the first critical path is electrically connected to the first input of the edge detection unit, and the output of the critical path is electrically connected to the second input of the edge detection unit. The counter is configured to measure a duration between an active edge of a start signal on the first input of the edge detection unit and an active edge of a stop signal on the second input of the edge detection unit in a clock period basis. The TDC is configured to measure a beginning portion and an end portion of the duration.

20 Claims, 7 Drawing Sheets

METHOD AND APPARATUS OF VOLTAGE SCALING TECHNIQUES

PRIORITY

This application claims the benefit of U.S. Provisional Application Ser. No. 61/711,849, filed on Oct. 10, 2012, entitled Method and Apparatus of Voltage Scaling Techniques," which application is hereby incorporated herein by reference.

FIELD OF DISCLOSURE

The present disclosure is related generally to circuits, and more specifically to voltage scaling techniques.

BACKGROUND

Many integrated circuits (ICs) in a given electronic device have different functions and can operate at different frequencies. Typically, all ICs and/or all parts of a given IC may receive a voltage potential that is substantially uniform. However, the market for consumer electronics is constantly improving. There is an increasing demand for circuit combinations that operate at increased speeds and consume less power to conserve battery-life, such as in wireless communication applications. As such, one manner of conserving power is adaptive voltage scaling (AVS) or dynamic voltage scaling (DVS), such that different ICs, or even different portions of a single IC, can operate with a voltage that is adaptively and dynamically optimized for application use while still maintain the necessary performance. Accordingly, power is conserved in the electronic device by not applying more than sufficient power for a given one or more of the ICs, according to the application use.

DETAILED DESCRIPTION

Making and using various embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

Some embodiments have one or a combination of the following features and/or advantages. A voltage scaling circuit includes a critical path, an edge detection unit, and a voltage control unit. Delay duration of the critical path is measured in the edge detection unit. The edge detection unit includes a counter and a time-to-digital converter (TDC). The counter measures the delay duration of the critical path in a clock period basis. The TDC measures a beginning portion and an end portion of the delay duration of the critical path. The voltage control unit calculates the delay duration of the critical path according to outputs of the counter and the TDC, and generates up/down instructions of the operation voltage. The operation voltage of the critical path, or of intellectual property (IP) block that the critical path belongs to, is configured to change according to the up/down instructions for the purpose of performance improving and/or power saving.

Figure 1:
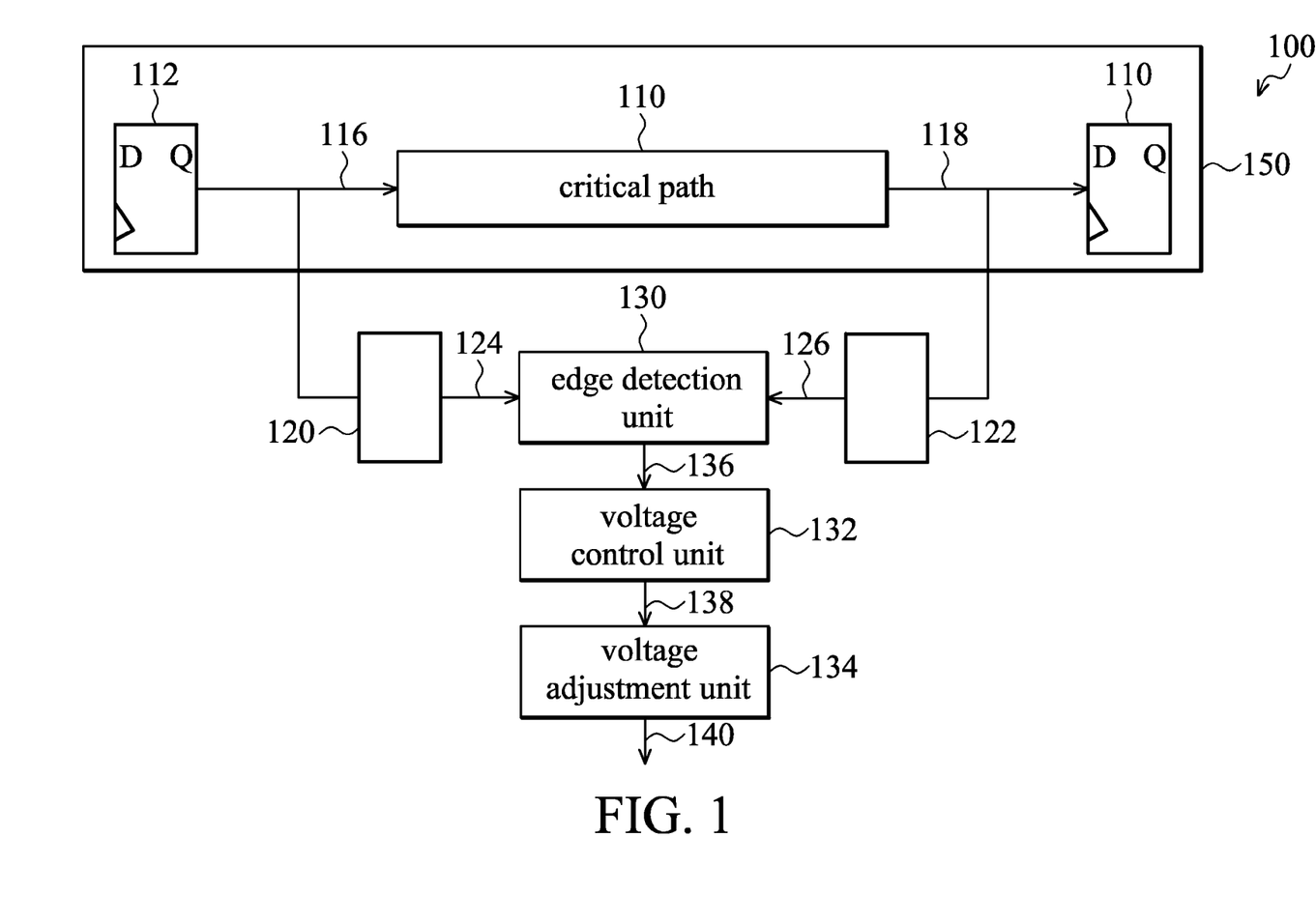
FIG. 1 is a schematic diagram of a voltage scaling circuit 100 according to some example embodiments.

FIG. 1 is a schematic diagram of a voltage scaling circuit 100 according to some example embodiments. The voltage scaling circuit 100 includes a critical path 110, flip flops 112 and 114, level shifters 120 and 122, an edge detection unit 130, a voltage control unit 132, a voltage adjustment unit 134, and conductive lines 116, 118, 124, 126, 136, 138 and 140. In some embodiments, a clock signal (not shown) is electrically connected to the flip flops 112 and 114, the edge detection unit 130 and the voltage control unit 132. The clock signal in FIG. 1 is omitted for simplicity. The critical path 110, flip flops 112 and 114, and conductive lines 116 and 118 are included in a intellectual property (IP) block 150 such as a central processing unit (CPU), a digital signal processor (DSP), a graphics processing unit (GPU) or the like. The critical path 110 is selected in the IP block 150 for some specific purposes such as power saving, performance improving, performance monitoring or the like. The critical path 110 includes a plurality of combinational logic gates, including, for example AND, OR, NAND, NOR, NOT, XOR, XNOR, multiplexer, etc. The flip flop 112 is a data launching flip flop of the critical path 110 such that data transition is set on the conductive line 116 after an active edge of the clock signal. The flip flop 114 is a data capturing flip flop of the critical path 110 such that data on the conductive line 118 is captured by the flip flop 114 on the next active edge of the clock signal. The output Q of the flip flop 112 is electrically connected through the conductive line 116 to an input of the critical path 110. An output of the critical path 110 is electrically connected through conductive line 118 to an input D of the flip flop 114.

The conductive line 116 is electrically connected through a level shifter 120 and a conductive line 124 to an input of the edge detection unit 130. The conductive line 118 is electrically connected through a level shifter 122 and a conductive line 126 to another input of the edge detection unit 130. The edge detection unit 130 is configured to measure a delay duration between an active edge of the input signal on the conductive line 124 and an active edge of the input signal on the conductive line 126. The measured delay amount is then transmitted through conductive lines 136 to the voltage control unit 132. The voltage control unit 132 is configured to give voltage up/down instructions through a conductive line 138 to a voltage adjustment unit 134 in accordance with the measured delay amount on the conductive line 136. In some embodiments, the voltage up/down instructions are generated through table look-up. The voltage adjustment unit 134 is configured to adjust output voltage 140 in accordance with the voltage up/down instructions on the conductive line 138. An example circuit for voltage adjustment unit 134 is a low drop-out (LDO) regulator or a DC-DC regulator etc.

In some embodiments, the output voltage 140 of the voltage adjustment unit 134 is configured to provide operation power to the flip flops 112, 114 and the critical path 110. In some embodiments, the output voltage 140 of the voltage adjustment unit 134 is configured to provide operation power to the IP block 150. In some embodiments, the output voltage 140 of the voltage adjustment unit 134 is configured to provide operation power to IP blocks other than the IP block 150.

In some embodiments, the level shifter 120 and 122 are configured to level shift lower voltage potential of signals on the conductive lines 116 and 118, respectively, into higher voltage potential of the corresponding signals inputted by the edge detection unit 130. In some embodiments, the level shifter 120 and 122 are not used when the voltage potential of operation voltage of the flip flops 112, 114 and the critical path 110 is substantially equal to or higher than the voltage potential of operation voltage of the edge detection unit 130.

Figure 2:
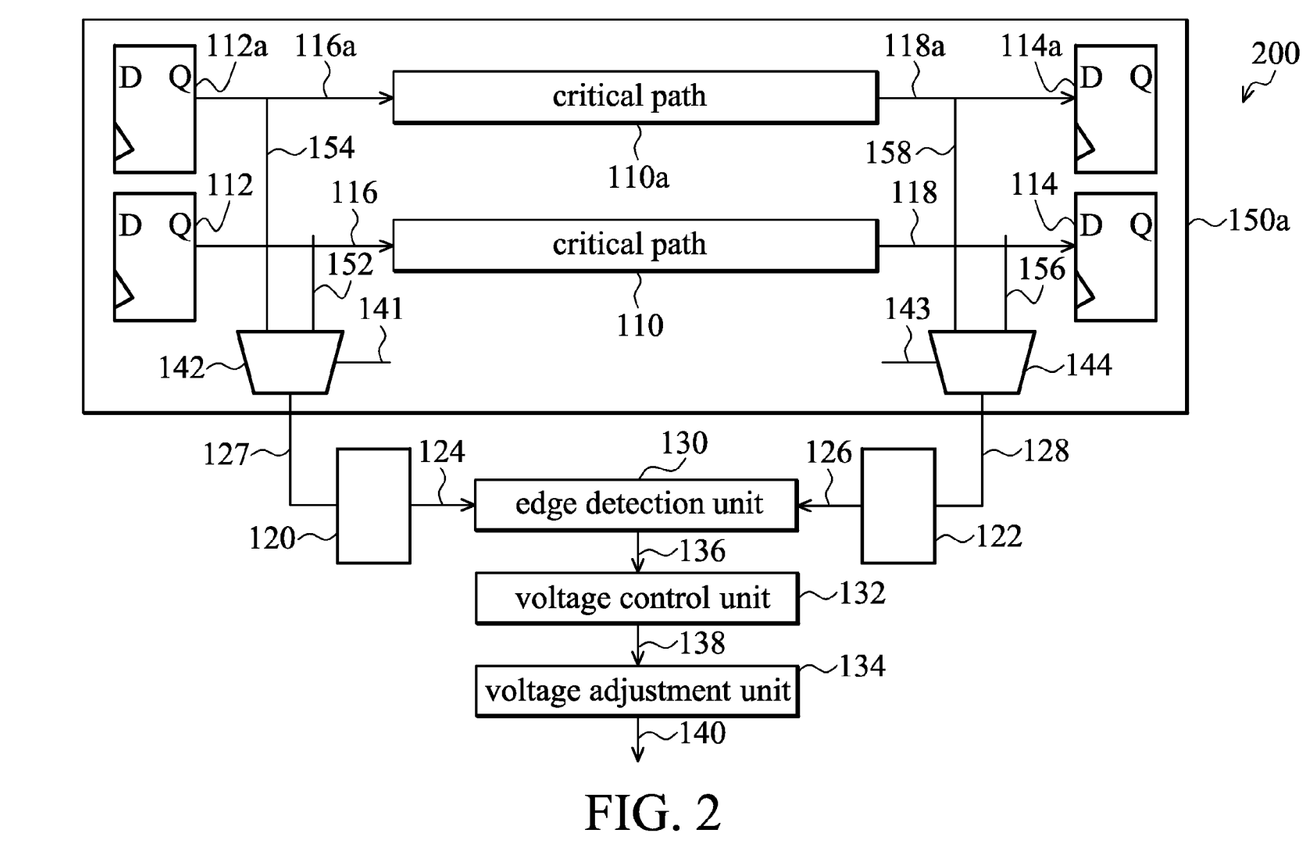
FIG. 2 is a schematic diagram of another voltage scaling circuit 200 according to some example embodiments.

FIG. 2 is a schematic diagram of another voltage scaling circuit 200 according to some example embodiments. Compared with the voltage scaling circuit 100 in FIG. 1, the voltage scaling circuit 200 includes similar elements except for an IP block 150a that is different from the IP block 150 in the voltage scaling circuit 100 in FIG. 1.

Compared with the IP block 150 in FIG. 1, the IP block 150a includes similar elements except additional critical path 110a, flip flops 112a and 114a, multiplexers 142 and 144, and conductive lines 116a, 118a, 141, 143, 152, 154, 156 and 158. In some embodiments, the IP block 150a is a central processing unit (CPU), a digital signal processor (DSP), a graphics processing unit (GPU) or a respective unit that performs specific functions. The critical paths 110 and 110a are selected in the IP block 150a for specific purposes such as power consumption monitoring, performance improving, performance monitoring or the like. The critical paths 110 and 110a include a plurality of combinational logic gates, for example AND, OR, NAND, NOR, NOT, XOR, XNOR, multiplexer, etc. Although two critical paths 110 and 110a are used in the voltage scaling circuit 200, other number of critical paths is within the scope of various embodiments. The flip flops 112 and 112a are data launching flip flops of the critical paths 110 and 110a respectively, and the flip flops 114 and 114a are data capturing flip flops of the critical paths 110 and 110a respectively. The outputs Q of the flip flops 112 and 112a are electrically connected through the conductive line 116 and 116a, respectively, to inputs of the critical paths 110 and 110a respectively. Outputs of the critical paths 110 and 110a are electrically connected through conductive lines 118 and 118a to input D of the flip flops 114 and 114a respectively.

Inputs of the multiplexer 142 are electrically connected through the conductive lines 152 and 154 to the conductive lines 116 and 116a respectively. An output of the multiplexer 142 is electrically connected through the conductive line 127, the level shifter 120 and the conductive line 124 to one input of the edge detection unit 130. Inputs of the multiplexer 144 are electrically connected through the conductive lines 156 and 158 to the conductive lines 118 and 118a respectively. An output of the multiplexer 144 is electrically connected through the conductive line 128, the level shifter 122 and the conductive line 126 to another input of the edge detection unit 130. Selection signals 141 and 143 of the multiplexers 142 and 144, respectively, are electrically connected to a plurality of logics (not shown). The plurality of logics selects one of the critical paths 110 and 110a to be monitored based on needs of functionalities. After one of the critical paths 110 and 110a is selected by the multiplexers 142 and 144, operations of the voltage scaling circuit 200 are similar to that of the voltage scaling circuit 100.

For example, the critical path 110 is configured to be monitored in IP block 150a for purpose of performance improving. For another example, the critical path 110a is configured to be monitored in IP block 150a for purpose of power saving. The plurality of logics is configured to select corresponding critical path through the selection signals 141 and 143 based on functional requirements of applications.

In some embodiments, a clock signal (not shown) is electrically connected to the flip flops 112, 112a, 114 and 114a, the edge detection unit 130 and the voltage control unit 132. The clock signal in FIG. 2 is omitted for simplicity.

Figure 3:
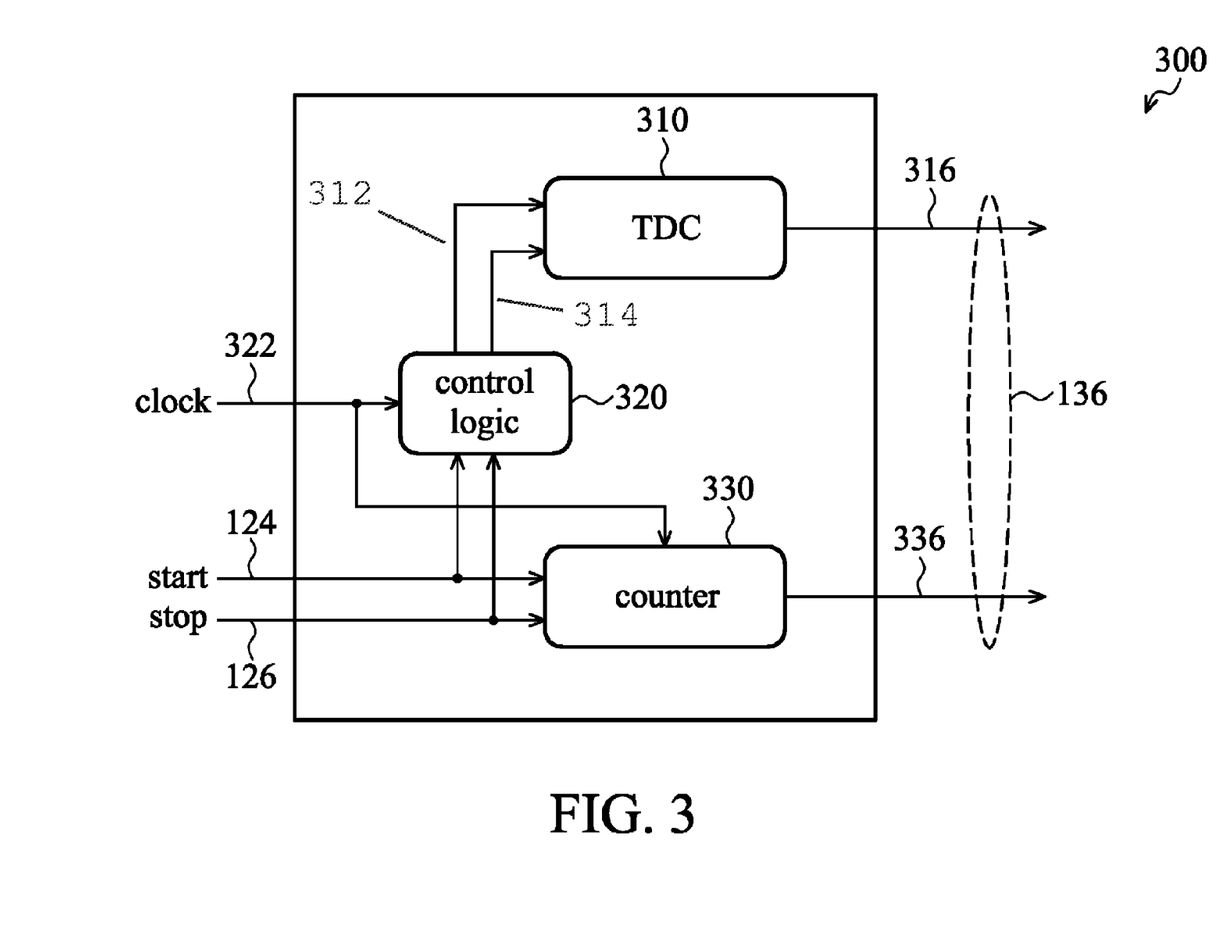
FIG. 3 is a schematic diagram of an edge detection unit 300 used in FIG. 1 and FIG. 2 according to some example embodiments.

FIG. 3 is a schematic diagram of an edge detection unit 300 used in FIG. 1 and FIG. 2 according to some example embodiments. The edge detection unit 300 includes a time-to-digital converter (TDC) 310, a control logic 320, a counter 330, input conductive lines 124, 126 and 322 and output conductive lines 316 and 336. The conductive lines 136 shown in FIG. 1 and FIG. 2 include output conductive lines 316 and 336 in FIG. 3. The conductive lines 136 are an output of the edge detection unit 300. The conductive lines 124 and 126 are similar to the corresponding ones shown in FIG. 1 and FIG. 2. The conductive lines 124, 126 and 322 are electrically connected to the control logic 320 and the counter 330. The signal on the conductive line 124 is referred to a "start" signal, and the signal on the conductive line 126 is referred to a "stop" signal. The signal on the conductive line 322 is a clock signal.

The counter 330 is configured to measure the delay duration between an active edge of the "start" signal 124 and an active edge of the "stop" signal 126 in a clock period basis. For example, the counter 330 is increased by one for each rising edge of the clock signal 322. Contents of the counter 330 are outputted on the conductive lines 336. Measuring in a clock period basis correctly assesses the delay duration between an active edge of the "start" signal 124 and an active edge of the "stop" signal 126 except delay time between an active edge of the "start" signal 124 and a corresponding active edge of the clock signal 322 and delay time between an active edge of the "stop" signal 126 and a corresponding active edge of the clock signal 322. In some embodiments, the delay time between an active edge of the "start" signal 124 and a corresponding active edge of the clock signal 322 is calculated by the TDC 310. In some embodiments, the delay time between an active edge of the "stop" signal 126 and a corresponding active edge of the clock signal 322 is also calculated by the TDC 310. To enable these two delay time calculations in the TDC 310 described above, the control logic 320 is configured to generate corresponding signals through the conductive lines 312 and 314 to the TDC 310 in a serial manner. Results of these two calculated delay time are also outputted on the conductive lines 316 in a serial manner. The timing of the signals generated by the control logic 320 on the conductive lines 312 and 314 are illustrated with reference to FIG. 4.

Figure 4:
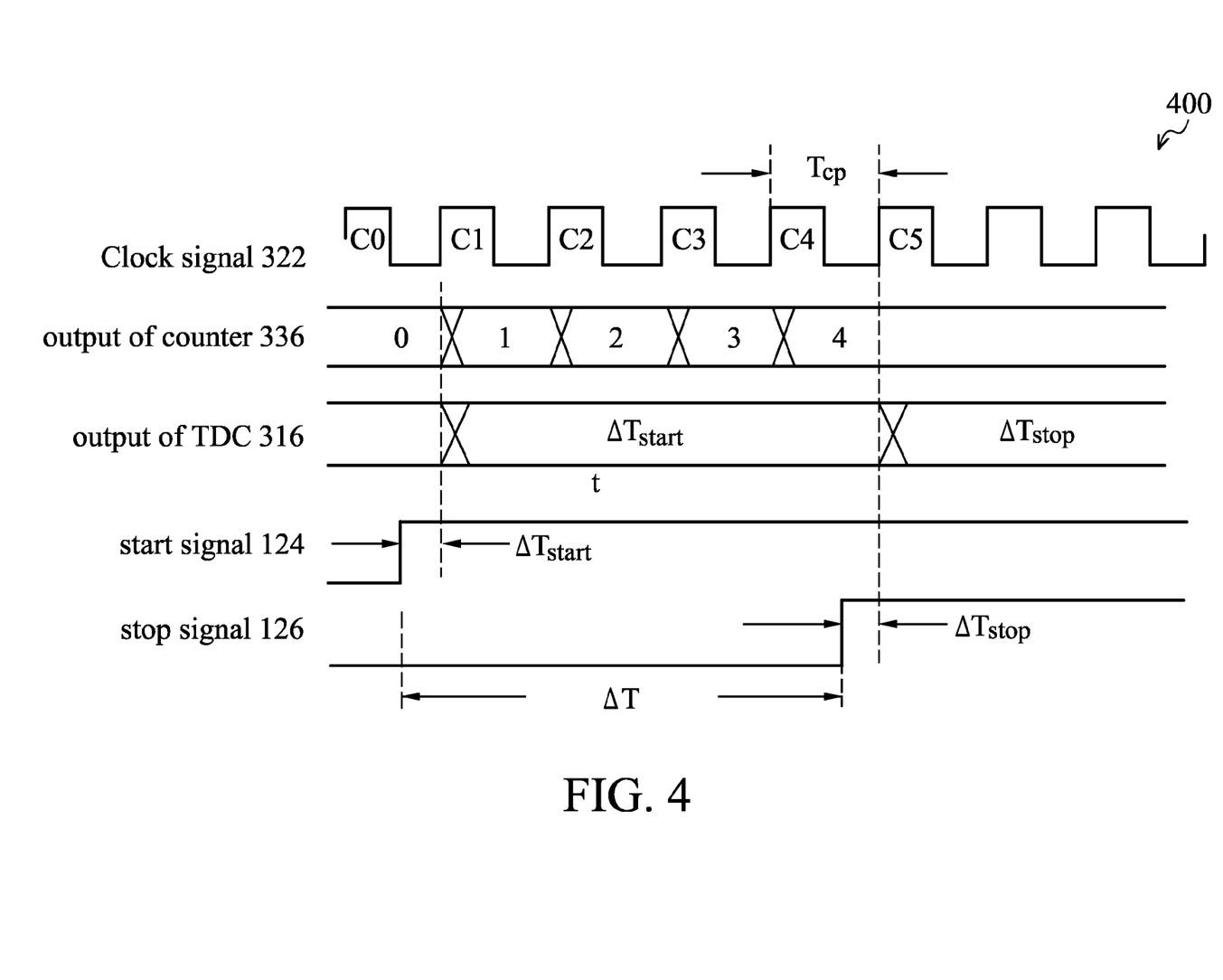
FIG. 4 is waveforms 400 to illustrate exemplary inputs/outputs of the edge detection unit 300 in FIG. 3 according to some example embodiments.

FIG. 4 is waveforms 400 to illustrate exemplary inputs/outputs of the edge detection unit 300 in FIG. 3 according to some example embodiments. A duration between the rising edge of the "start" signal 124 and the rising edge of the "stop" signal 126 is represented as "Δ T". Cycle time of the clock signal 322 is represented as "$T_{cp}$". A rising edge of the "start" signal 124 is activated at cycle C0. As a result, the counter 330 in FIG. 3 is increased by one at cycle C1 and each of following rising edge of the clock signal 322, for example at cycle C2 and beyond. A rising edge of the "stop" signal 126 is activated at cycle C4. As a result, the counter 330 in FIG. 3 is stopped to increase at cycle C5 and beyond. The contents of the counter 330 in FIG. 3 are kept unchanged and are outputted on the conductive lines 336 in FIG. 3.

The duration between the rising edge of the "start" signal 124 and the rising edge of cycle C1 is represented as "$\Delta T_{start}$". The duration between the rising edge of the "stop" signal 126 and the rising edge of cycle C5 is represented as "$\Delta T_{stop}$". The control logic 320 in FIG. 3 is configured to serially generate corresponding control signals and serially transmit through the conductive lines 312 and 314 in FIG. 3 to the TDC 310 in FIG. 3 to calculate "$\Delta T_{start}$" and "$\Delta T_{stop}$", respectively. For example, in cycle C0, the control logic 320 is configured to generate a rising edge of the "start" signal on the conductive line 312 and to generate a rising edge of cycle C1 of the clock signal 322 on the conductive line 314 for the TDC 310 to calculate "$\Delta T_{start}$". For another example, in cycle C4, the control logic 320 is configured to generate a rising edge of the "stop" signal on the conductive line 312 and to generate a rising edge of cycle C5 of the clock signal 322 on the conductive line 314 for the TDC 310 to calculate "$\Delta T_{stop}$". In some embodiments, the "$\Delta T_{start}$" is a beginning portion of the duration "$\Delta T$" between an active edge of the "start" signal 124 and a corresponding active edge of the clock signal 322. In some embodiments, the "$\Delta T_{stop}$" is configured to calculate an end portion of the duration "$\Delta T$" between another corresponding active edge of the clock signal 322 and an active edge of the "stop" signal 126. For example, in FIG. 4, an end portion of the duration "$\Delta T$" is between the rising edge of cycle C4 and the rising edge of the "stop" signal 126. In some embodiments, the beginning portion of the duration "$\Delta T$" and the end portion of the duration "$\Delta T$" is separated.

The duration "$\Delta T$" between the rising edge of the "start" signal 124 and the rising edge of the "stop" signal 126 is calculated by the voltage control unit 132 in FIG. 1 and FIG. 2 according to following equation.

$$\Delta T = \Delta T_{start} + ((\text{output of counter 336}) - 1) \times T_{cp} + (T_{cp} - \Delta T_{stop}) \quad (1)$$

The equation (1) is for illustration purposes and is further simplified to following equation.

$$\Delta T = \Delta T_{start} + (\text{output of counter 336} \times T_{cp}) - \Delta T_{stop} \quad (2)$$

Figure 5:
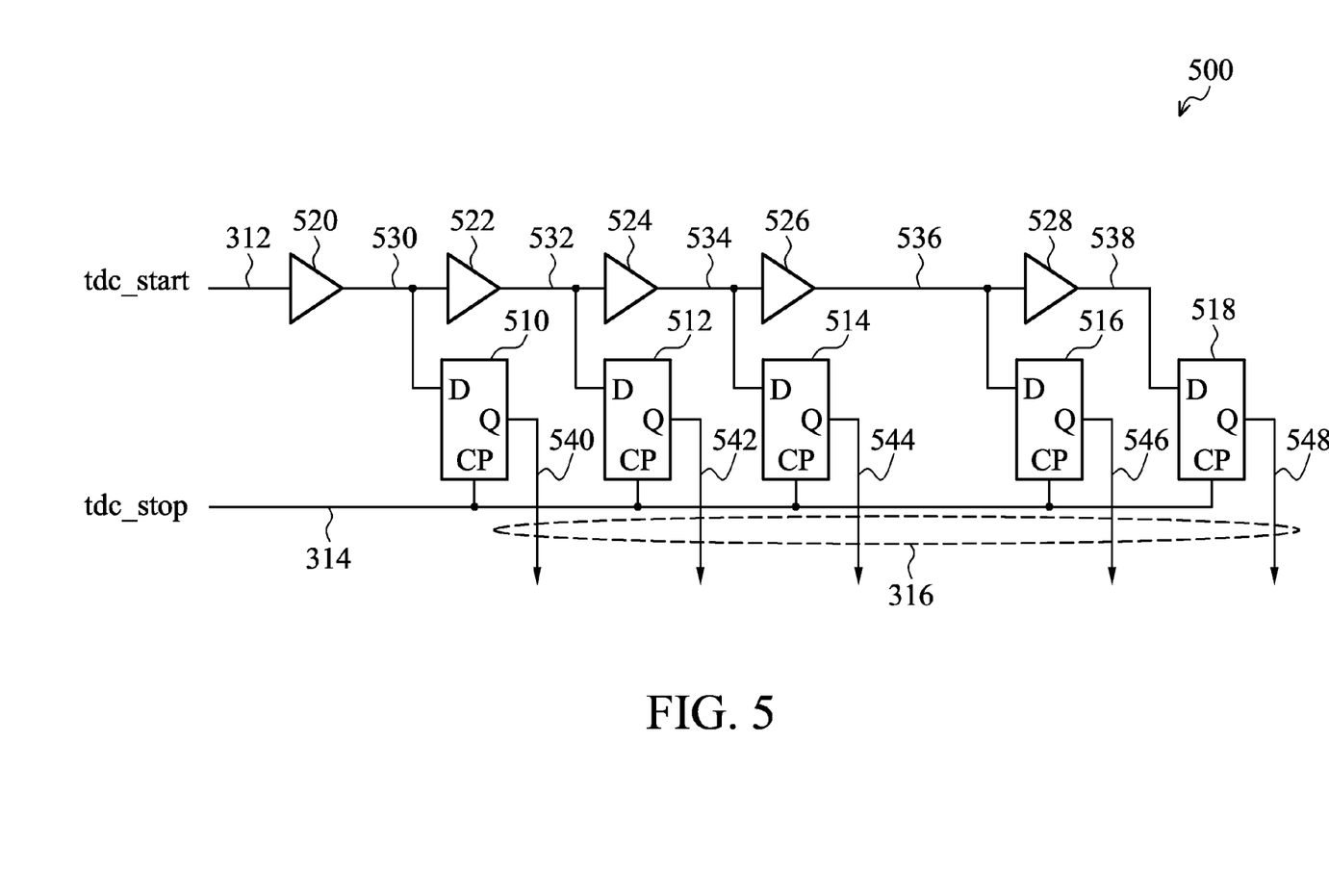
FIG. 5 illustrates a schematic diagram of a TDC 500 used in FIG. 3 according to some example embodiments.

FIG. 5 illustrates a schematic diagram of a TDC 500 according to some example embodiments. The TDC 500 is an embodiment of the TDC 310 in FIG. 3. The TDC 500 includes flip flops 510-518, delay elements 520-528, conductive lines 312, 314 and 530-548. The conductive lines 312 and 314 are similar to the corresponding ones described in FIG. 3, and are electrically connected to the control logic 320 in FIG. 3. Signal on the conductive line 312 is represented as "tdc_start" signal, and signal on the conductive line 314 is represented as "tdc_stop" signal. D input of the flip flop 510 receives the "tdc_start" signal from the conductive line 530 through one delay element 520. D input of the flip flop 512 receives the "tdc_start" signal from the conductive line 532 through two delay elements 520 and 522. D input of the flip flop 514 receives the "tdc_start" signal from the conductive line 534 through three delay elements 520, 522 and 524. D input of the flip flop 516 receives the "tdc_start" signal from the conductive line 536 through four delay elements 520, 522, 524 and 526. D input of the flip flop 518 receives the "tdc_start" signal from the conductive line 538 through five delay elements 520, 522, 524, 526 and 528. The "tdc_stop" signal is electrically connected to CP input of each of flip flops 510-518. The active edge of the "tdc_stop" signal triggers each of the flip flops 510-518 to capture the corresponding voltage potential on the conductive lines 530-538, respectively, from D input of each of the flip flops 510-518 to Q output of each of the flip flops 510-518, respectively. The Q outputs of the flip flops 510-518 are digital values representing the delay duration between an active edge of the "tdc_start" signal and an active edge of the "tdc_stop" signal.

For example, at time t0, the "tdc_start" signal has a rising edge such that the "tdc_start" signal goes "1" from "0". At time t1, the "tdc_stop" signal has a rising edge such that the "tdc_stop" signal goes "1" from "0". At time t1, the "tdc_start" signal is propagated through the delay elements 520, 522 and 524 to the conductive line 534 such that voltage potential of each of the conductive lines 530, 532 and 534 is "1", and voltage potential of each of the conductive lines 536 and 538 is "0". The rising edge of the "tdc_stop" signal at time t1 triggers each of the flip flops 510-518 to capture the corresponding voltage potential on conductive lines 530-538, respectively, from D input of each of the flip flops 510-518 to Q output of each of the flip flops 510-518, respectively. In this example, Q outputs of the flip flops 510-518 are "1, 1, 1, 0, 0" that represents a delay duration between time t0 and time t1.

Although the TDC 500 only has five delay elements and five flip flops, other numbers of delay elements and flip flops are within the scope of various embodiments.

In some embodiments, delays of the delay elements 520-528 are equal to each other. In some embodiments, the delay elements 520-528 include configurable options to adjust corresponding delay of each of the delay elements 520-528 as described in FIG. 6 for details.

Figure 6:
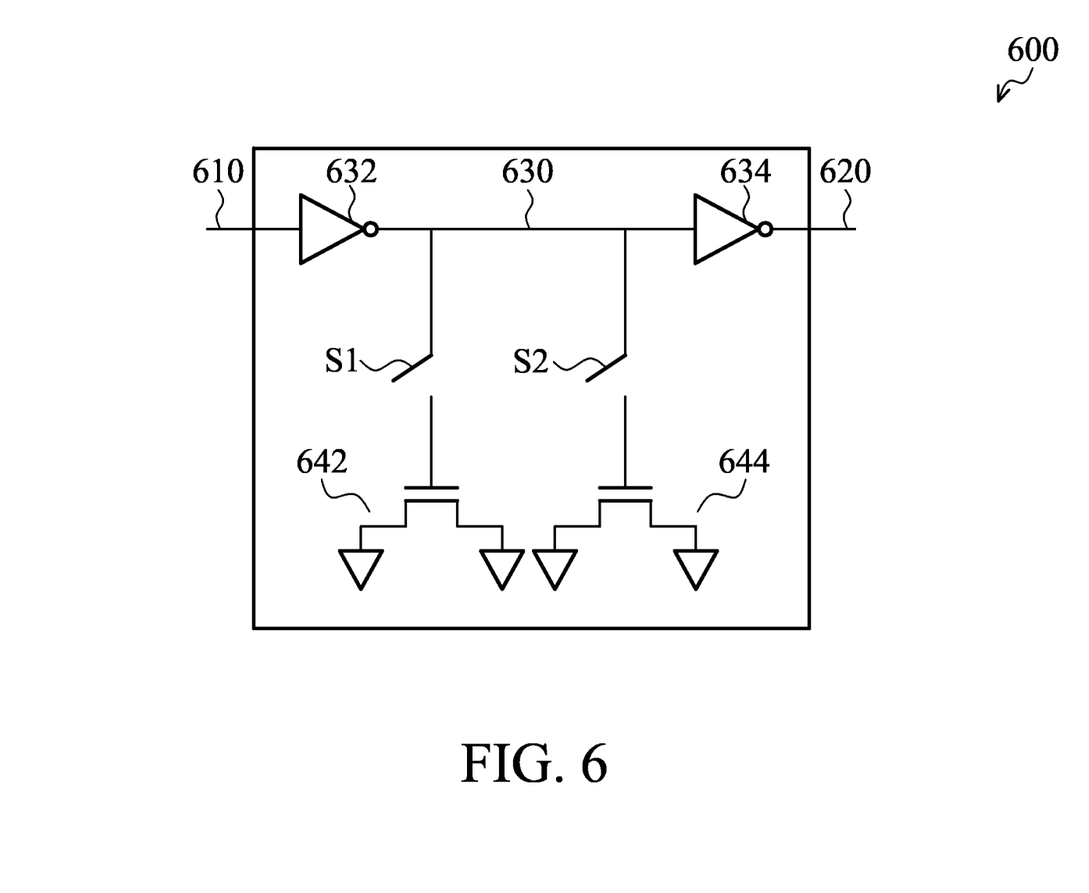
FIG. 6 illustrates a schematic diagram of a delay element 600 used in FIG. 5 according to some example embodiments.

FIG. 6 illustrates a schematic diagram of a delay element 600 according to some example embodiments. The delay element 600 is an embodiment of the delay elements 520-528 in FIG. 5. The delay element 600 includes inverters 632 and 634, switches S1 and S2, capacitances 642 and 644, and conductive lines 610, 620 and 630. Although the inverter 632 and 634 are used in the delay element 600, other types of circuits and logic gates, such as AND, NAND, OR, NOR, XOR or XNOR, are within the scope of various embodiments. A delay duration of the delay element 600 depends on delays of the inverters 632 and 634, the switches S1 and S2, and the capacitances 642 and 644. The switches S1 and S2 are configured to connect the capacitance 642 and the capacitance 644, respectively, to the conductive line 630 such that the delay duration of the delay element 600 is configurable.

The delay duration of the delay element 600 is determined by an input transition and output load of the inverters 632 and 634. When the load of the conductive line 630 is larger, the delay duration of the inverter 632 is increased as the output load of the inverter 632 is increased. In such a situation, the delay duration of the inverter 634 is also increased as the input transition of the inverter 634 is increased. For example, in a first setting, the switch S1 is set to "ON" and the switch S2 is set to "OFF". As a result, the capacitance 642 is connected to the conductive line 630 but the capacitance 644 is not connected. The delay duration of the delay element 600 in the first setting is increased more than a second setting in which the switches S1 and S2 are set to "OFF" because the load of the conductive line 630 in the first setting is larger. For another example, in a third setting, the switches S1 and S2 are set to "ON". As a result, the capacitances 642 and 644 are connected to the conductive line 630 simultaneously. The delay duration of the delay element 600 in the third setting is increased more than the first setting because the load of the conductive line 630 in the third setting is larger.

Although the delay element 600 includes two switches and two capacitances, another number of the switches and capacitance is within the scope of various embodiments.

Figure 7:
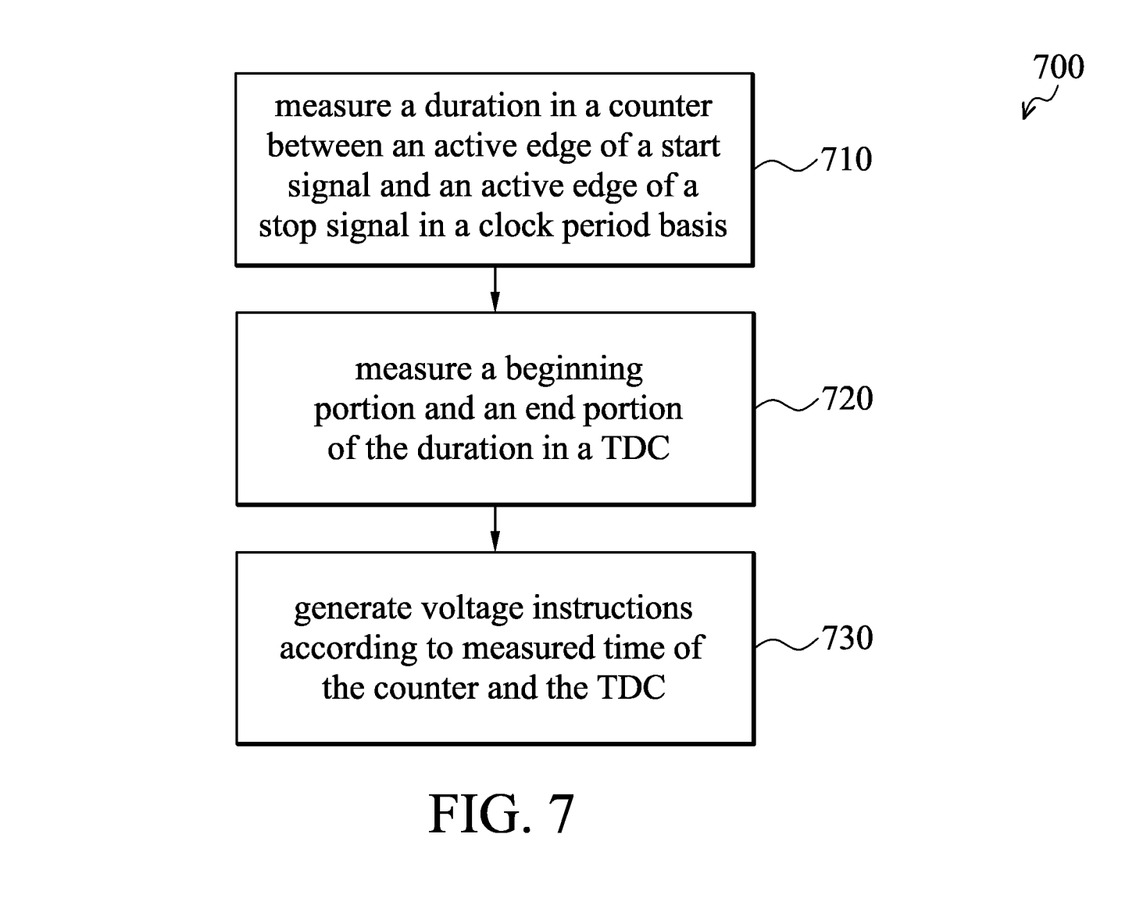
FIG. 7 illustrates a flow chart 700 of a voltage scaling method of the voltage scaling circuit 100 in FIG. 1 and the voltage scaling circuit 200 in FIG. 2 according to some example embodiments.

FIG. 7 illustrates a flow chart 700 of a voltage scaling method of the voltage scaling circuit 100 in FIG. 1 and the voltage scaling circuit 200 in FIG. 2 according to some example embodiments.

In step 710, duration between an active edge of a start signal on an input of an edge detection unit and an active edge of a stop signal on another input of the edge detection unit is measured in a counter in a clock period basis. For example, in FIG. 4, a rising edge of the "start" signal 124 is activated at cycle C0. As a result, the counter 330 in FIG. 3 is increased by one at cycle C1 and each of following rising edge of the clock signal 322, for example at cycle C2 and beyond. A rising edge of the "stop" signal 126 is activated at cycle C4. As a result, the counter 330 in FIG. 3 is stopped to increase at cycle C5 and beyond. The contents of the counter 330 in FIG. 3 are kept unchanged and are outputted on the conductive lines 336 in FIG. 3.

In step 720, a beginning portion and an end portion of the duration is measured in a TDC. For example, in FIG. 4, "$\Delta T_{start}$" is a beginning portion of the duration "$\Delta T$" between an active edge of the "start" signal 124 and a corresponding active edge of the clock signal 322. "$\Delta T_{stop}$" is configured to calculate an end portion of the duration "$\Delta T$" between another corresponding active edge of the clock signal 322 and an active edge of the "stop" signal 126. For example, in FIG. 4, an end portion of the duration "$\Delta T$" is between the rising edge of cycle C4 and the rising edge of the "stop" signal 126. The end portion of the duration "$\Delta T$" is substantially equal to "$T_{cp} - \Delta T_{stop}$" in which "$T_{cp}$" is cycle time of clock signal 322. To enable time measurement of "$\Delta T_{start}$" and "$\Delta T_{stop}$" in the TDC 310 in FIG. 3, a control logic 320 in FIG. 3 is configured to generate corresponding signals through conductive lines 312 and 314 in FIG. 3 to the TDC 310 in FIG. 3 in a serial manner. Results of these two measured time are also outputted on the conductive lines 316 in FIG. 3 in a serial manner.

In step 730, voltage instructions are generated according to measured time of the counter and the TDC. For example, in FIGS. 1 and 2, the measured time are transmitted through conductive lines 136 to a voltage control unit 132. The voltage control unit 132 is configured to calculate the duration according to the equations (1) or (2), and to give voltage up/down instructions through a conductive line 138 to a voltage adjustment unit 134. In some embodiments, the voltage up/down instructions are generated through table look-up. In some embodiments, the calculated duration in the voltage control unit 132 is compared with a first threshold. A voltage up instruction is configured to transmit to the voltage adjustment unit 134 if the calculated duration is smaller than the first threshold. In some embodiments, the calculated duration in the voltage control unit 132 is compared with a second threshold. a voltage down instruction is configured to transmit to the voltage adjustment unit 134 if the calculated duration is larger than the second threshold.

In some embodiments, a voltage scaling circuit includes a first critical path and an edge detection unit. The first critical path includes an input and an output. The edge detection unit includes a first input, a second input, a counter and a time-to-digital converter (TDC). The input of the first critical path is electrically connected to the first input of the edge detection unit, and the output of the critical path is electrically connected to the second input of the edge detection unit. The counter is configured to measure a duration between an active edge of a start signal on the first input of the edge detection unit and an active edge of a stop signal on the second input of the edge detection unit in a clock period basis. The TDC is configured to measure a beginning portion and an end portion of the duration.

In some embodiments, a voltage scaling circuit includes an intellectual property (IP) block and an edge detection unit. The IP block includes a first critical path. The edge detection unit includes a counter and a time-to-digital converter (TDC). An input and an output of the first critical path are electrically connected to a first output and a second output, respectively, of the IP block. The first output and the second output of the IP block are electrically connected to the edge detection unit. The counter is configured to measure a duration between an active edge of a start signal on the first output of the IP block and an active edge of a stop signal on the second output of the IP block in a clock period basis. The TDC is configured to measure a beginning portion and an end portion of the duration.

In some embodiments, a method of configuring a voltage scaling circuit includes measuring a duration in a counter between an active edge of a start signal on an input of an edge detection unit and an active edge of a stop signal on another input of the edge detection unit in a clock period basis. The method also includes measuring a beginning portion and an end portion of the duration in a TDC. The method further includes generating voltage instructions according to measured time of the counter and the TDC.

While the disclosure has been described by way of examples and in terms of disclosed embodiments, the invention is not limited to the examples and disclosed embodiments. To the contrary, various modifications and similar arrangements are covered as would be apparent to those of ordinary skill in the art. Therefore, the scope of the appended claims should be accorded the broadest interpretation so as to encompass such modifications and arrangements.

What is claimed is:

1. A voltage scaling circuit comprising:
   a first critical path comprising an input and an output; and
   an edge detection unit including a first input and a second input, comprising
      a counter; and
      a time-to-digital converter (TDC)
   wherein
      the input of the first critical path is electrically connected to the first input of the edge detection unit, and the output of the critical path is electrically connected to the second input of the edge detection unit;
      the counter is configured to measure a duration between an active edge of a start signal on the first input of the edge detection unit and an active edge of a stop signal on the second input of the edge detection unit in a clock period basis; and
      the TDC is configured to measure a beginning portion and an end portion of the duration.

2. The voltage scaling circuit of claim 1, wherein timing of the stop signal is similar to timing of the start signal plus a corresponding propagation delay of the first critical path.

3. The voltage scaling circuit of claim 1, further comprising a voltage control unit that is configured to generate instructions according to measured results of the counter and the TDC.

4. The voltage scaling circuit of claim 3, wherein operation voltage of the first critical path is configured to change according to the instructions.

5. The voltage scaling circuit of claim 1, wherein the TDC comprises a delay element, the delay element including configurable options to adjust delay duration of the delay element.

6. The voltage scaling circuit of claim 1, further comprising a second critical path, the second critical path comprising an input and an output, the input of the second critical path being electrically connected to the first input of the edge detection unit, and the output of the second critical path being electrically connected to the second input of the edge detection unit.

7. The voltage scaling circuit of claim 6, wherein one of the first critical path and the second critical path is selected to measure the corresponding duration.

8. A voltage scaling circuit, comprising:
   an intellectual property (IP) block comprising a first critical path; and
   an edge detection unit, comprising
      a counter; and
      a time-to-digital converter (TDC);
   wherein
      an input and an output of the first critical path are electrically connected to a first output and a second output, respectively, of the IP block;
      the first output and the second output of the IP block are electrically connected to the edge detection unit;
      the counter is configured to measure a duration between an active edge of a start signal on the first output of the IP block and an active edge of a stop signal on the second output of the IP block in a clock period basis; and
      the TDC is configured to measure a beginning portion and an end portion of the duration.

9. The voltage scaling circuit of claim 8, wherein timing of the stop signal is similar to timing of the start signal plus a corresponding propagation delay of the first critical path.

10. The voltage scaling circuit of claim 8, further comprising a voltage control unit that is configured to generate instructions according to measured results of the counter and the TDC.

11. The voltage scaling circuit of claim 10, wherein operation voltage of the IP block is configured to change according to the instructions.

12. The voltage scaling circuit of claim 8, wherein the TDC comprises a delay element, the delay element including configurable options to adjust delay duration of the delay element.

13. The voltage scaling circuit of claim 8, wherein the IP block further comprising a second critical path, the second critical path comprising an input and an output, and the input of the second critical path being electrically connected to the first output of the IP block, and the output of the second critical path being electrically connected to the second output of the IP block.

14. The voltage scaling circuit of claim 13, wherein one of the first critical path and the second critical path is selected to measure the corresponding duration.

15. A method of configuring a voltage scaling circuit, comprising:
   measuring a duration in a counter between an active edge of a start signal on an input of an edge detection unit and an active edge of a stop signal on another input of the edge detection unit in a clock period basis;
   measuring a beginning portion and an end portion of the duration in a TDC; and
   generating voltage instructions according to measured time of the counter and the TDC.

16. The method of claim 15, wherein the TDC comprises a configurable delay element, and further including adjusting a delay duration of the delay element.

17. The method of claim 15, further comprising changing the operation voltage according to the voltage instructions.

18. The method of claim 15, wherein the voltage instructions are generated through table look-up.

19. The method of claim 18, further comprising comparing the duration with a first threshold, a voltage up instruction is generated if the duration is smaller than the first threshold.

20. The method of claim 18, further comprising comparing the duration with a second threshold, a voltage down instruction is generated if the duration is larger than the second threshold.

* * * * *